(12) United States Patent
Li et al.

(10) Patent No.: US 8,154,293 B2
(45) Date of Patent: Apr. 10, 2012

(54) APPARATUS AND METHOD FOR ACQUISITION AND RECONSTRUCTION OF NON-CPMG PROPELLER SEQUENCES

(75) Inventors: Zhiqiang Li, Phoenix, AZ (US); Ken-Pin Hwang, Sugar Land, TX (US); Ajeetkumar Gaddipati, Waukesha, WI (US); Xiaoli Zhao, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 393 days.

(21) Appl. No.: 12/533,757

(22) Filed: Jul. 31, 2009

(65) Prior Publication Data

US 2011/0025325 A1 Feb. 3, 2011

(51) Int. Cl.
*G01V 3/00* (2006.01)
(52) U.S. Cl. ........................................ 324/318
(58) Field of Classification Search ........... 324/300–322
See application file for complete search history.

(56) References Cited

U.S. PATENT DOCUMENTS

| | | | |
|---|---|---|---|
| 6,265,873 B1 | 7/2001 | Le Roux | |
| 6,882,148 B2 * | 4/2005 | Pipe | 324/307 |
| 7,030,609 B2 * | 4/2006 | Pipe | 324/309 |
| 7,132,828 B2 | 11/2006 | Lustig et al. | |
| 7,382,127 B2 | 6/2008 | Gaddipati et al. | |
| 7,408,345 B2 | 8/2008 | Bammer et al. | |
| 2008/0009701 A1 | 1/2008 | Avram et al. | |

OTHER PUBLICATIONS

Le Roux; Non-CPMG Fast Spin Echo with Full Signal; Journal of Magnetic Resonance; vol. 155, pp. 278-292, 2002.
Le Roux et al.; Feasibility study of non Carr Purcell Meiboom Gill single shot fast spin echo in spinal cord diffusion imaging; Magnetic Resonance Materials in Physics, Biology and Medicine; vol. 14, pp. 243-247, 2002.
Pipe et al.; Multishot Diffusion-Weighted FSE Using Propeller MRI; Magnetic Resonance in Medicine; vol. 47, pp. 42-52, 2002.
Pipe et al.; Turboprop: Improved Propeller Imaging; Magnetic Resonance in Medicine; vol. 55, pp. 380-385, 2006.

* cited by examiner

*Primary Examiner* — Dixomara Vargas
(74) *Attorney, Agent, or Firm* — Ziolkowski Patent Solutions Group, SC

(57) ABSTRACT

An apparatus and method of MR imaging is disclosed. The apparatus and method comprises segmenting acquisition of an echo train into separate odd and even acquisition blades in k-space, wherein the odd and even acquisition blades extend orthogonally through a common reference point in a central region of k-space. A segment of MR data is acquired using a quadratic phase modulation scheme, wherein a first set of MR echo signals occurring after odd-numbered RF refocusing pulses are stored in the odd acquisition blade, and a second set of MR echo signals occurring after even-numbered RF refocusing pulses are stored in the even acquisition blade. This acquisition and segmentation is repeated until a sufficient number of blades are acquired to fill k-space. Finally, an image is reconstructed from the acquisition blades.

20 Claims, 4 Drawing Sheets

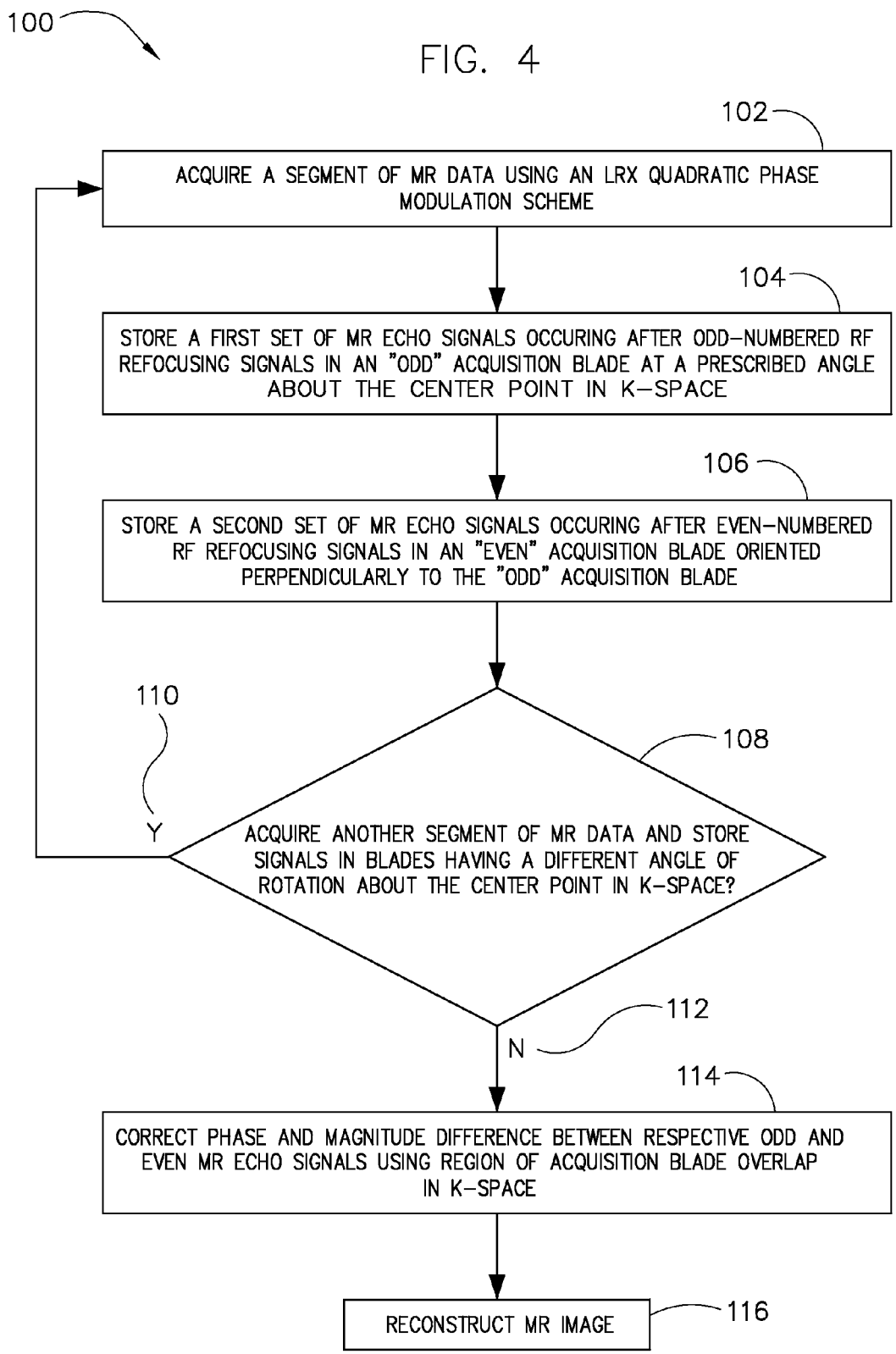

APPARATUS AND METHOD FOR ACQUISITION AND RECONSTRUCTION OF NON-CPMG PROPELLER SEQUENCES

BACKGROUND OF THE INVENTION

The invention relates generally to MR imaging and, more particularly, to a method and apparatus of split-blade data collection for PROPELLER MRI in combination with a quadratic phase modulation scheme.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In certain clinical imaging applications, it is desirable to acquire "diffusion-weighted" images in which tissues that have either higher or lower water self-diffusion characteristics relative to other tissues are emphasized. Typically, diffusion-weighting is implemented using a pair of large gradient pulses bracketing a refocusing RF pulse. Because spins undergoing irregular motion due to diffusion are not completely re-phased by the second gradient pulse of the pair, signal from these spins is attenuated such that tissues with higher water diffusion experience increased signal loss.

Most clinical diffusion-weighted imaging is performed using single-shot sequences, such as single-shot echo-planar imaging (EPI). However, single-shot acquisitions typically have limited resolution and are sensitive to susceptibility-induced image distortions and eddy-current effects. For multi-shot acquisitions, non-diffusive bulk motions can cause shot-specific phase shifts that can destructively interfere when the multiple shots are combined, resulting in image artifacts. To reduce image artifacts, these phase shifts may be corrected for each shot individually before combining shots into a final image. Multiple approaches for performing such a motion correction for multi-shot acquisitions are known in the art.

An alternative to diffusion-weighted EPI imaging is known as a diffusion-weighted fast spin-echo (FSE) method of imaging. Compared to diffusion-weighted EPI imaging, diffusion-weighted FSE methods for imaging are far less susceptible to $B_0$-rated artifacts and can be implemented with less intensive gradient requirements. However, despite these advantages, diffusion-weighted FSE imaging has several challenges. First, there is an extremely high phase sensitivity to motion in diffusion-weighted FSE imaging which, if left uncorrected, can lead to motion artifacts. Secondly, in diffusion-weighted FSE, the signal will generally violate the Carr-Purcell -Meiboom-Gill (CPMG) condition. A CPMG sequence is a type of spin-echo pulse sequence consisting of a 90° radio frequency (RF) pulse followed by an echo train induced by successive 180° pulses. To meet the CPMG condition, the initial transverse magnetization must be aligned with the axis of the refocusing pulses. As the signal in diffusion-weighted FSE will generally not meet the CPMG condition, the signal is substantially degraded.

In an effort to address the issue of signal degradation in conventional diffusion-weighted FSE imaging, LeRoux proposed a quadratic phase modulation scheme in U.S. Pat. No. 6,265,873. The quadratic phase modulation scheme proposed by LeRoux, which will be referred to hereafter as the "LRX" phase modulation scheme, allowed the use of a low flip angle and a long echo train in FSE imaging. Unlike conventional diffusion-weighted FSE imaging, the LRX phase modulation scheme has been shown to sustain signal magnitude and phase, regardless of the signal phase at the beginning of the echo train. In LRX phase modulation, the odd and even echoes must be acquired at the same k-space location (i.e., double encoded) due to the difference between the odd and even echoes in the echo train. Two intermediate images are generated from the respective odd and even echoes, and the two intermediate images are then combined together to form a final image. Unfortunately, due to this double encoding, the echo train in an LRX modulation scheme must be twice as long as the echo train of a conventional FSE method to fill the same k-space matrix size. This, along with the combination of the two intermediate images, leads to an undesirably elongated acquisition time.

Yet another diffusion-weighted FSE imaging technique that has been developed is commonly referred to as diffusion-weighted Periodically Rotated Overlapping Parallel Lines with Enhanced Reconstruction (PROPELLER) imaging. PROPELLER imaging is an FSE technique wherein an MR signal is encoded by collecting data during an echo train such that a rectangular strip, or "blade", through the center of k-space is measured. In subsequent echo trains, this blade is incrementally rotated in k-space about the origin, thereby allowing adequate measurement for sufficient regions of k-space for a desired resolution. Diffusion-weighted PROPELLER imaging is particularly advantageous in that it has increased insensitivity to motion-induced phase errors. However, conventional diffusion-weighted PROPELLER imaging uses a phase modulation scheme known as "XY2" phase modulation. In the XY2 phase modulation scheme, the flip angle of the refocusing RF pulse is usually close to 180 degrees, which may cause a high level of specific absorption rate (SAR), as well as sensitivity to dielectric effect at 3 T. Additionally, the echo train in the XY2 phase modulation scheme is limited in length, since the signal decays quickly.

It would therefore be desirable to have a system and method of MR imaging implementing a PROPELLER or similar imaging protocol in combination with an LRX phase modulation scheme to reduce the scan time, dielectric artifacts, and/or background streaking artifacts that may be present in conventional diffusion-weighted FSE imaging.

BRIEF DESCRIPTION OF THE INVENTION

Embodiments of the invention provide a method and apparatus of split-blade data collection for PROPELLER MRI in combination with a quadratic phase modulation scheme.

In accordance with one aspect of the invention, an MR imaging apparatus includes a magnetic resonance imaging (MRI) system having a plurality of gradient coils positioned about a bore of a magnet, an RF transceiver system and an RF switch controlled by a pulse module to transmit RF signals to an RF coil assembly to acquire MR images. The MR imaging apparatus also includes a computer programmed to segment acquisition of an echo train into separate odd and even acquisition blades in k-space, wherein the odd and even acquisition blades extend orthogonally through a common reference point in a central region of k-space. A segment of MR data is acquired using a quadratic phase modulation scheme, wherein a first set of MR echo signals occurring after odd-numbered RF refocusing pulses are stored in the odd acquisition blade, and a second set of MR echo signals occurring after even-numbered RF refocusing pulses are stored in the even acquisition blade. Acquisition of at least one subsequent echo train is segmented into the odd and even acquisition blades, and the odd and even acquisition blades are rotated at a prescribed interval about the common reference point in the central region of k-space. Another segment of MR data is acquired from the at least one subsequent echo train using the quadratic phase modulation scheme such that MR echo signals occurring after odd-numbered RF refocusing pulses are again stored in the odd acquisition blade and such that MR echo signals occurring after even-numbered RF refocusing pulses are again stored in the even acquisition blade. Finally, an image is reconstructed from the acquisition blades.

In accordance with another aspect of the invention, a method for acquiring magnetic resonance (MR) data is provided, the method comprising acquiring a segment of MR data using a quadratic phase modulation scheme, storing a first set of MR echo signals occurring after odd-numbered RF refocusing pulses in an echo train in an odd acquisition blade, and storing a second set of MR echo signals occurring after even-numbered RF refocusing pulses in the echo train in an even acquisition blade, wherein the odd acquisition blade and the even acquisition blade are perpendicularly oriented with respect to one another at a common center point in k-space. The method further comprises acquiring at least another segment of MR data using the quadratic phase modulation scheme and storing the odd and even MR echo signals in the respective odd and even acquisition blades, wherein the odd and even acquisition blades are rotated at a prescribed interval about the common center point in k-space. Phase and magnitude differences between the respective odd and even MR echo signals are corrected using data at a region of odd and even acquisition blade overlap, and an image from the acquisition blades is reconstructed after correcting the phase and magnitude differences.

In accordance with another aspect of the invention, a computer program is stored on a computer readable storage medium, the computer program causing the computer to segment acquisition of an echo train into separate corresponding odd and even acquisition blades in k-space, wherein the corresponding odd and even acquisition blades extend orthogonally through a common reference point in a central region of k-space. Further, a segment of MR data is acquired using a quadratic phase modulation scheme, wherein odd MR echo signals in the echo train are stored in the odd acquisition blade, and even MR echo signals are stored in the even acquisition blade. The computer program also causes the computer to segment acquisition of at least one subsequent echo train into the corresponding odd and even acquisition blades, wherein the corresponding odd and even acquisition blades are rotated at a prescribed interval about the common reference point in the central region of k-space, and acquire another segment of MR data from the at least one subsequent echo train using the quadratic phase modulation scheme such that the odd MR echo signals are again stored in the odd acquisition blade and the even MR echo signals are again stored in the even acquisition blade. The computer program further causes the computer to reconstruct an image from the odd and even acquisition blades.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 4 is a flowchart detailing an embodiment of the present invention.

DETAILED DESCRIPTION OF THE PREFERRED EMBODIMENT

A system and method is shown for reducing scan time and image artifacts through the use of split-blade data collection for PROPELLER MRI in combination with a quadratic phase modulation scheme.

Figure 1:
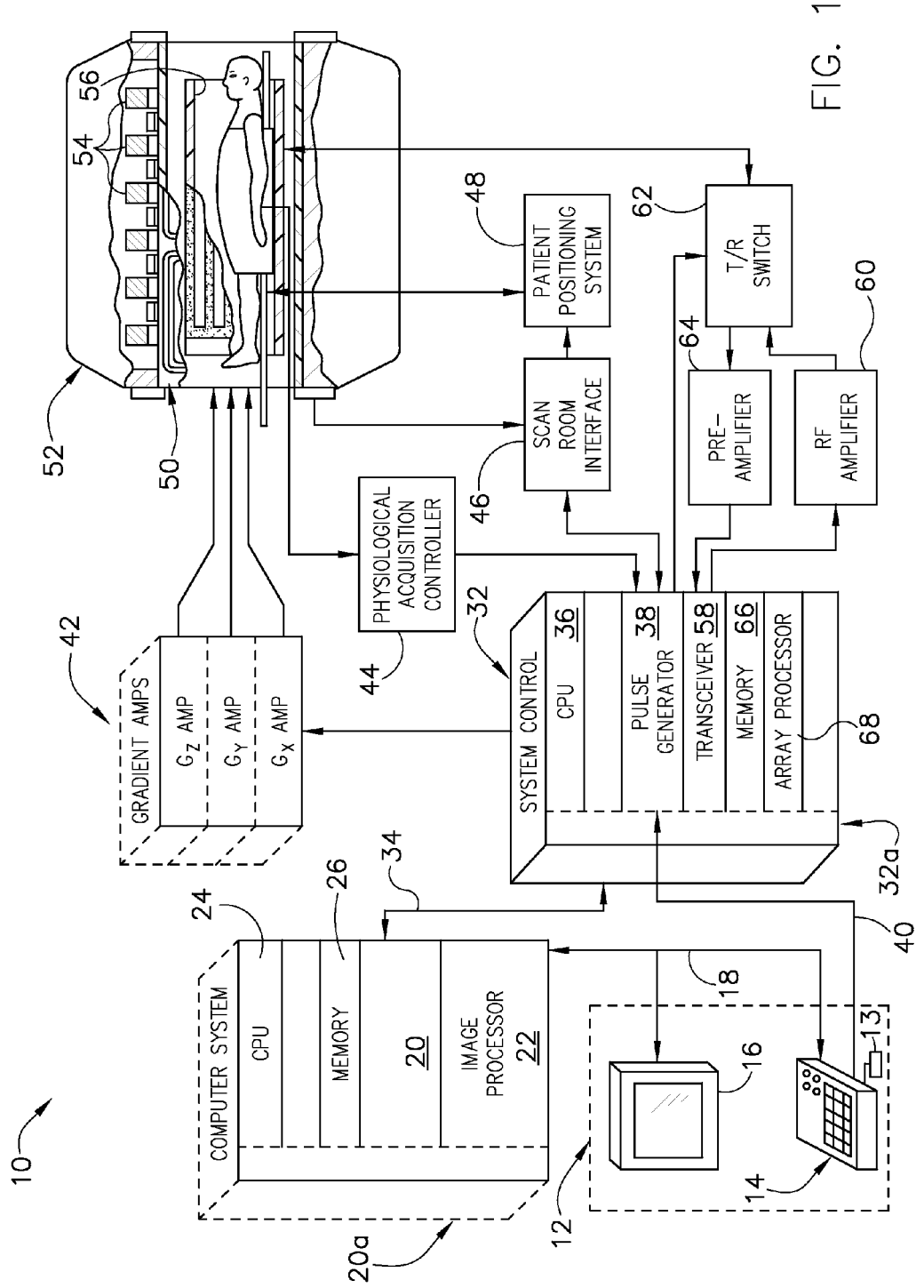
FIG. 1 is a schematic block diagram of an exemplary MR imaging system for use with an embodiment of the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

As discussed above, applying a quadratic phase modulation scheme known as the LRX phase modulation scheme in diffusion-weighted FSE imaging effectively sustains signal magnitude and phase, but acquisition times due to double encoding are extended. Embodiments of present invention eliminate the need for acquiring odd and even echoes at the same k-space location (i.e., double encoded) by implementing a split-blade PROPELLER or similar imaging protocol in combination with an LRX phase modulation scheme.

In an LRX phase modulation scheme, quadratic phase modulation of the refocusing pulses in an FSE sequence sustain signal magnitude and phase regardless of the signal phase at the beginning of the echo train. Two sets of signals in the single echo train are generated with the LRX phase modulation scheme, wherein the two sets of signals can be represented as $S_1$ (odd signals) and $S2$ (even signals), where:

$$S_1 = (I+jQ)e^{\phi} \quad \text{(Eqn. 1)}$$

and $$S_2 = (I-jQ)e^{\phi}. \quad \text{(Eqn. 2)}$$

The magnitude of I and Q are proportional to the in-phase and out-of-phase components of the signal $S_0$ at the start of the echo train, defined as the time point half an echo spacing before the first refocusing pulse. The signal $S_0$ can be defined as:

$$S_0 = (|I| + j|Q|). \quad \text{(Eqn. 3)}$$

I and Q are complex values whose relative phase varies with the refocusing flip angle. For example, the I and Q relative phase may vary from approximately 90 to 135 degrees for flip angles between 90 and 180 degrees. As this modulation is based on the RF transmit and receive fields, the relative phase and magnitude of $S_1$, $S_2$, and the "true" signal $S_0$ can be assumed to be smoothly varying in space.

Typically, k-space is double encoded with both $S_1$ and $S_2$ to form two intermediate images based on $S_1$ and $S_2$. The two intermediate images are then algebraically combined to form a final image. However, as discussed above, double encoding increases the echo train length, which in turn leads to an increased scan time. Embodiments of the present invention, on the other hand, eliminate the need for double encoding by utilizing split-blade PROPELLER imaging, where odd echoes and even echoes from the same TR are placed into respective perpendicular blades by switching the readout/phase encode gradients between the logic x and y axes in k-space.

Figure 2:
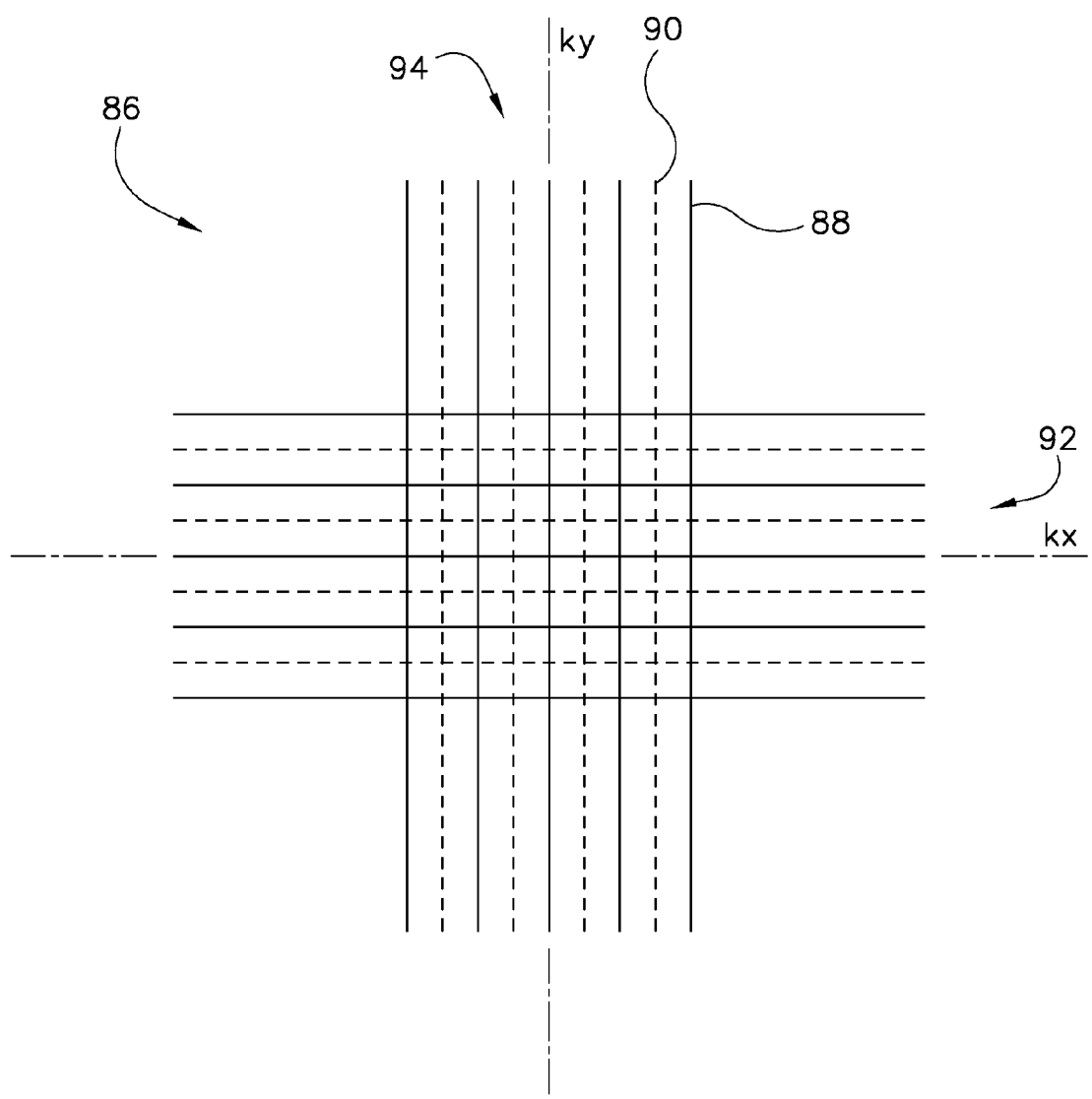
FIG. 2 is a schematic representation of a k-space filling scheme in accordance with an embodiment of the invention.

Referring now to FIG. 2, the filling of k-space in accordance with an embodiment of the invention is illustrated. K-space 86, in the illustrated embodiment, corresponds to data collected along the kx-ky axes. Odd spin-echoes are collected relative to the kx axis, while even spin-echoes are collected relative to the ky axis. Each line of k-space 88 corresponds with a single spin-echo acquired, while each line 90 of k-space represent undersampled regions of k-space that are synthesized using acquired lines of k-space 88, as will be discussed herein. Therefore, blade 92 represents odd spin-echoes in k-space 86, while blade 94 represents even spin-echoes in k-space 86. While only nine lines of k-space are illustrated in respective blades 92, 94, it is to be understood that more or fewer lines of k-space may be present in each blade. If more lines of k-space are acquired (thereby creating wider blades), parallel imaging techniques used to synthesize unacquired lines of k-space are easier to implement.

As FIG. 2 illustrates, blade 92 of odd spin-echoes is positioned in k-space perpendicularly with respect to blade 94, which represents the even spin-echoes. Each blade of k-space 92, 94 is acquired during each echo train. While not shown, blades 92, 94 are incrementally rotated about the center of k-space (that is, the intersection of the kx-ky axis) with each subsequent echo train until k-space 86 is filled. For example, eight blades may be acquired in four echo trains. The rotation of blades 92, 94 through subsequent TRs enables a full k-space data set to be acquired, where the k-space data set may then be transformed into an imaging space for image reconstruction.

As discussed above, each line 90 of k-space represents an undersampled line of k-space that may be synthesized using data from neighboring lines of k-space. There are several known techniques for synthesizing the undersampled regions of k-space, including ARC and Mutual Calibration. With these techniques, acquired data from respective blades 92 and 94 is used to fill in unacquired k-space regions of each blade, thereby allowing scan time to be reduced while increasing blade width. With wider blades 92, 94, image quality may be improved. Parallel imaging techniques such as ARC use acquired data from the same blade to synthesize the undersampled region of that blade. Mutual Calibration techniques, on the other hand, use data from the corresponding orthogonal blade to synthesize the undersampled regions of each blade.

Figure 3:
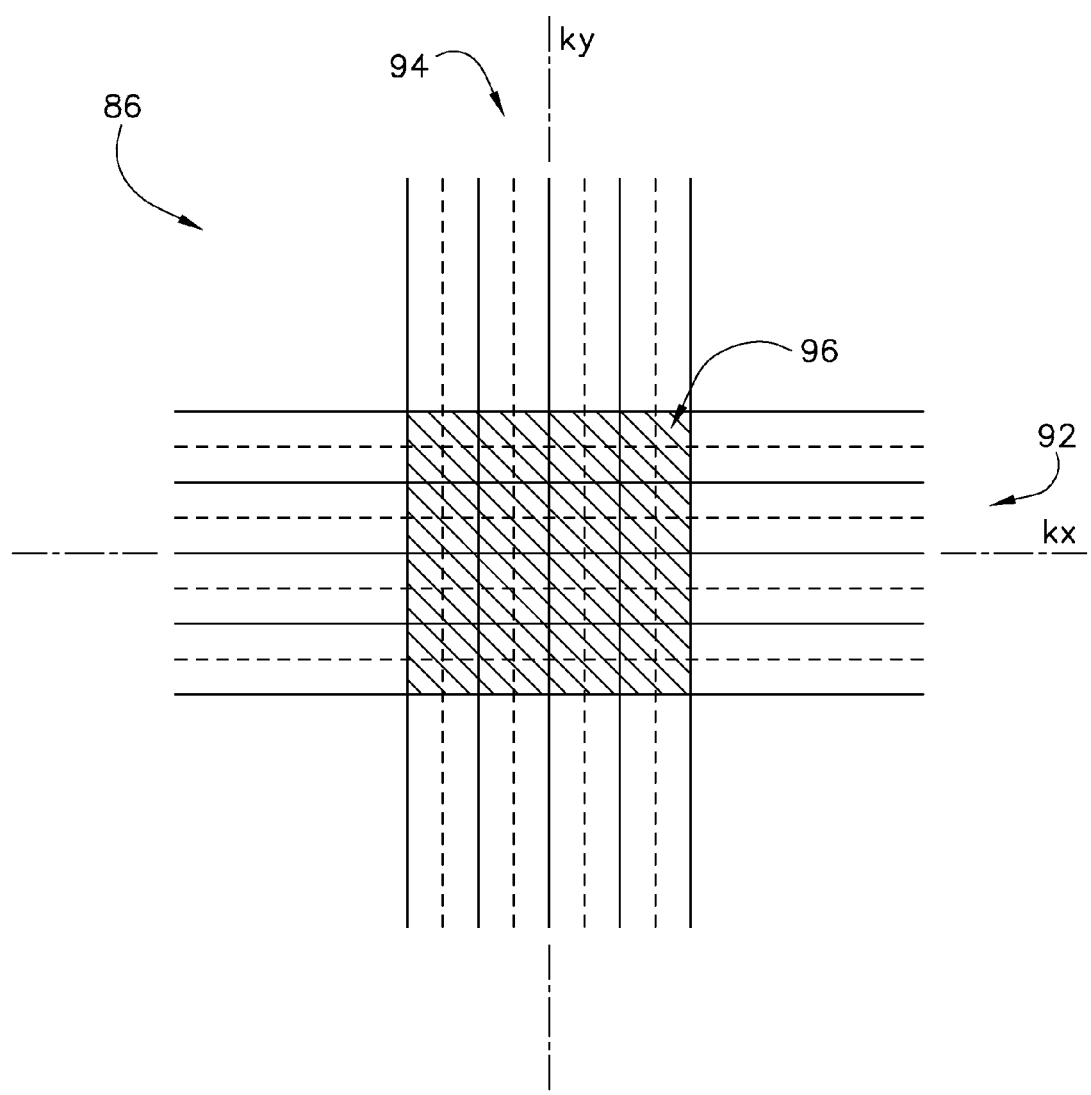
FIG. 3 is a schematic representation of a k-space filling scheme in accordance with an embodiment of the invention.

After a full k-space data set is filled, a final image may be reconstructed. However, phase and magnitude differences between the even and odd echoes may lead to destructive interference and, in turn, to substantial image artifacts. Thus, it would be advantageous to correct for phase and magnitude errors during image reconstruction. With the present embodiments of the invention, this phase and magnitude correction may be performed using the k-space center region where the blades formed by $S_1$ and $S_2$ overlap. FIG. 3 shows blades 92, 94 in k-space 86, wherein the overlapping region 96 is used to correct the phase and magnitude difference between $S_1$ and $S_2$. To perform this correction, a low resolution approximation of "true" signal $S_0$ is calculated using data from the overlapping region 96. The phase of $S_1$ is first corrected to remove destructive phase by multiplying the blade image of $S_1$ by:

$$\text{conj}(S_{1L})/|S_{1L}|, \qquad \text{(Eqn. 4)}$$

where $S_{1L}$ is the low resolution image of $S_1$ calculated using data from the overlapping region 96 in k-space 86. The phase of $S_2$ is similarly corrected to remove destructive phase by multiplying the blade image of $S_2$ by:

$$\text{conj}(S_{2L})/|S_{2L}|, \qquad \text{(Eqn. 5)}$$

where $S_{2L}$ is the low resolution image of $S_2$ calculated using data from the overlapping region 96 in k-space 86.

Magnitude correction for each split-blade pair of $S_1$ and $S_2$ may also be performed using data from the overlapping region 96 in k-space 86. As discussed above with respect to Eqn. 3, the signal $S_0$ can be defined as $S_0=(|I|+j|Q|)$. The magnitude of $S_0$ can thus be approximated as the average of the magnitude of $S_{1L}$ and $S_{2L}$, or:

$$S_{0A}=(|S_{1L}|+|S_{2L}|)/2=(|I+jQ|+|I-jQ|)/2, \qquad \text{(Eqn. 6)}$$

where $S_{0A}$ is the magnitude approximation of $S_0$. Then, using the magnitude estimation $S_{0A}$ or an averaged estimation calculated from all split-blade pairs, magnitude correction can be performed by multiplying the blade images by modulation functions to form corrected blade images $S_{1C}$ and $S_{2C}$, where:

$$S_{1C}=(S_{0A}/|S_{1L}|)S_1, \qquad \text{(Eqn. 7)}$$

and $$S_{2C}=(S_{0A}/|S_{2L}|)S_2. \qquad \text{(Eqn. 8)}$$

Again, $S_{1L}$ and $S_{2L}$ are the low resolution images of S1 and S2, respectively, calculated using data from the overlapping region 96 in k-space 86.

Limits may be placed on the modulation functions represented above in Eqn. 7 and Eqn. 8 so as to prevent image artifacts. For example, an upper limit may be placed to prevent excessive noise amplification, while a lower limit may be placed to prevent shading. Also, magnitude correction may be applied in the same step as phase correction, on a channel-by-channel basis, prior to channel combination of the blades. Alternatively, magnitude approximation and/or correction may be performed after channel combination, thereby taking advantage of the higher signal of the combined blade images.

Another embodiment of the invention enables magnitude and phase correction to be applied in k-space, again taking advantage of the overlapping regions of the blades. With this embodiment, target calibration data is produced by a Fourier transform of the $S_{0A}$ image produced from the overlapping regions of the blades, which represents a fully-sampled region of k-space. Using this target calibration data, the low-order data of the blades (that is, the acquired data of the blades within the overlapping regions) is "trained" to the target calibration data. By training to the target calibration data, coefficients may be determined that can be used to synthesize corrected k-space data for the unacquired lines of k-space (such as lines 90 shown in FIG. 2) or substitute corrected k-space data for the acquired lines of k-space (such as lines 88 shown in FIG. 2). These coefficients are used to correct acquired k-space data points and synthesize unacquired k-space data points using neighboring acquired k-space data points, thereby filling all k-space locations with corrected k-space data. In this way, overall scan time and image artifacts can be reduced, while image quality can be maintained or improved.

Referring now to FIG. 4, flow chart 100 showing the steps of an embodiment of the present invention is illustrated. First, at block 102, a segment of MR data is acquired using the LRX quadratic phase modulation scheme as described above. At block 104, a first set of MR echo signals occurring after odd-numbered RF refocusing pulses in an echo train are stored in an "odd" acquisition blade. Next, at block 106, a second set of MR echo signals occurring after even-numbered RF refocusing pulses in the echo train are stored in an "even" acquisition blade. The "odd" and "even" acquisition blades are oriented perpendicular with respect to one another at a common center point in k-space, forming a split-blade configuration. At block 108, it is determined whether or not k-space needs to be filled by acquiring another segment of MR data and storing the MR echo signals in the respective "odd" and "even" acquisition blades, whereby the acquisition blades are rotated at a prescribed interval about the common center point in k-space. If another segment of MR data is to be acquired 110, then the steps of blocks 102-108 are repeated. If no more segments of MR data are to be acquired 112, then the process proceeds to block 114. At block 114, when a sufficient number of acquisition blades are acquired, phase and magnitude differences between the respective odd and even MR echo signals are corrected using data from the region of acquisition blade overlap at the common center point in k-space. Finally, at block 116, after differences in phase and magnitude are corrected, an image is reconstructed from the acquisition blades.

Embodiments of the invention are capable of substantially reducing scan time for diffusion-weighted PROPELLER imaging by eliminating the need for double encoding that was present in conventional quadratic phase modulation schemes. Furthermore, image artifacts such as dielectric artifacts and background streaking artifacts are reduced with embodiments of the invention.

A technical contribution for the disclosed method and apparatus is that it provides for a computer implemented acquire MR data though split-blade data collection for PROPELLER MRI in combination with a quadratic phase modulation scheme.

Thus, in accordance with one aspect of the invention, an MR imaging apparatus includes a magnetic resonance imaging (MRI) system having a plurality of gradient coils positioned about a bore of a magnet, an RF transceiver system and an RF switch controlled by a pulse module to transmit RF signals to an RF coil assembly to acquire MR images. The MR imaging apparatus also includes a computer programmed to segment acquisition of an echo train into separate odd and even acquisition blades in k-space, wherein the odd and even acquisition blades extend orthogonally through a common reference point in a central region of k-space. A segment of MR data is acquired using a quadratic phase modulation scheme, wherein a first set of MR echo signals occurring after odd-numbered RF refocusing pulses are stored in the odd acquisition blade, and a second set of MR echo signals occurring after even-numbered RF refocusing pulses are stored in the even acquisition blade. Acquisition of at least one subsequent echo train is segmented into the odd and even acquisition blades, and the odd and even acquisition blades are rotated at a prescribed interval about the common reference point in the central region of k-space. Another segment of MR data is acquired from the at least one subsequent echo train using the quadratic phase modulation scheme such that MR echo signals occurring after odd-numbered RF refocusing pulses are again stored in the odd acquisition blade and such that MR echo signals occurring after even-numbered RF refocusing pulses are again stored in the even acquisition blade. Finally, an image is reconstructed from the acquisition blades.

In accordance with another aspect of the invention, a method for acquiring magnetic resonance (MR) data is provided, the method comprising acquiring a segment of MR data using a quadratic phase modulation scheme, storing a first set of MR echo signals occurring after odd-numbered RF refocusing pulses in an echo train in an odd acquisition blade, and storing a second set of MR echo signals occurring after even-numbered RF refocusing pulses in the echo train in an even acquisition blade, wherein the odd acquisition blade and the even acquisition blade are perpendicularly oriented with respect to one another at a common center point in k-space. The method further comprises acquiring at least another segment of MR data using the quadratic phase modulation scheme and storing the odd and even MR echo signals in the respective odd and even acquisition blades, wherein the odd and even acquisition blades are rotated at a prescribed interval about the common center point in k-space. Phase and magnitude differences between the respective odd and even MR echo signals are corrected using data at a region of odd and even acquisition blade overlap, and an image from the acquisition blades is reconstructed after correcting the phase and magnitude differences.

In accordance with another aspect of the invention, a computer program is stored on a computer readable storage medium, the computer program causing the computer to segment acquisition of an echo train into separate corresponding odd and even acquisition blades in k-space, wherein the corresponding odd and even acquisition blades extend orthogonally through a common reference point in a central region of k-space. Further, a segment of MR data is acquired using a quadratic phase modulation scheme, wherein odd MR echo signals in the echo train are stored in the odd acquisition blade, and even MR echo signals are stored in the even acquisition blade. The computer program also causes the computer to segment acquisition of at least one subsequent echo train into the corresponding odd and even acquisition blades, wherein the corresponding odd and even acquisition blades are rotated at a prescribed interval about the common reference point in the central region of k-space, and acquire another segment of MR data from the at least one subsequent echo train using the quadratic phase modulation scheme such that the odd MR echo signals are again stored in the odd acquisition blade and the even MR echo signals are again stored in the even acquisition blade. The computer program further causes the computer to reconstruct an image from the odd and even acquisition blades.

This written description uses examples to disclose embodiments of the invention, including the best mode, and also to enable any person skilled in the art to practice the invention, including making and using any devices or systems and performing any incorporated methods. The patentable scope of embodiments of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
a computer programmed to:
segment acquisition of an echo train into separate odd and even acquisition blades in k-space, wherein the odd and even acquisition blades extend orthogonally through a common reference point in a central region of k-space;
acquire a segment of MR data using a quadratic phase modulation scheme, wherein a first set of MR echo signals occurring after odd-numbered RF refocusing pulses are stored in the odd acquisition blade, and a second set of MR echo signals occurring after even-numbered RF refocusing pulses are stored in the even acquisition blade;
segment acquisition of at least one subsequent echo train into the odd and even acquisition blades, and rotate the odd and even acquisition blades at a prescribed interval about the common reference point in the central region of k-space;
acquire another segment of MR data from the at least one subsequent echo train using the quadratic phase modulation scheme, wherein MR echo signals occurring after odd-numbered RF refocusing pulses are again stored in the odd acquisition blade and wherein MR echo signals occurring after even-numbered RF refocusing pulses are again stored in the even acquisition blade; and
reconstruct an image from the acquisition blades.

2. The MRI apparatus of claim 1 wherein the flip angle of both the odd-numbered RF refocusing pulses and the even-numbered refocusing pulses is less than 180 degrees.

3. The MRI apparatus of claim 2 wherein the flip angle of both the odd-numbered RF refocusing pulses and the even-numbered refocusing pulses is greater than 90 degrees.

4. The MRI apparatus of claim 1 wherein the computer is further programmed to correct the differences in phase and magnitude between the echoes occurring after odd-numbered RF refocusing pulses and the echoes occurring after even-numbered RF refocusing pulses prior to image reconstruction.

5. The MRI apparatus of claim 4 wherein computer is configured to correct the differences in phase and magnitude using MR data from a region of acquisition blade overlap in the central region of k-space.

6. The MRI apparatus of claim 1 wherein the computer is further programmed to undersample each segment of MR data, wherein multiple lines of k-space data in each acquisition blade are initially unfilled, and wherein the unfilled lines of k-space data are bounded by acquired lines of k-space data.

7. The MRI apparatus of claim 6 wherein the computer is further programmed to synthesize k-space data in each of the respective odd and even acquisition blades using weights calculated from acquired k-space data in any part of the correspondingly orthogonal acquisition blade or in an overlapping region of both orthogonal acquisition blades.

8. The MRI apparatus of claim 7 wherein the computer is further programmed to correct the low-resolution differences in phase and magnitude between the acquisition blades using MR data from a region of acquisition blade overlap in the central region of k-space.

9. The MRI apparatus of claim 7 wherein the computer is further programmed to synthesize k-space data for each acquisition blade using target signal data calculated using data in a region of acquisition blade overlap in the central region of k-space.

10. A method for acquiring magnetic resonance (MR) data, the method comprising:
  acquiring a segment of MR data using a quadratic phase modulation scheme;
  storing a first set of MR echo signals occurring after odd-numbered RF refocusing pulses in an echo train in an odd acquisition blade;
  storing a second set of MR echo signals occurring after even-numbered RF refocusing pulses in the echo train in an even acquisition blade, wherein the odd acquisition blade and the even acquisition blade are perpendicularly oriented with respect to one another at a common center point in k-space;
  acquiring at least another segment of MR data using the quadratic phase modulation scheme and storing the odd and even MR echo signals in the respective odd and even acquisition blades, wherein the odd and even acquisition blades are rotated at a prescribed interval about the common center point in k-space; and
  correcting phase and magnitude differences between the respective odd and even MR echo signals using data at a region of odd and even acquisition blade overlap; and
  reconstructing an image from the acquisition blades after correcting the phase and magnitude differences.

11. The method of claim 10 wherein a flip angle of both odd and even RF refocusing pulses in each echo train is less than 180 degrees.

12. The method according to claim 10 wherein each segment of MR data is undersampled, wherein multiple lines of k-space data in each acquisition blade are initially unfilled, and wherein the unfilled lines of k-space data are bounded by acquired lines of k-space data.

13. The method according to claim 12 further comprising synthesizing k-space data in each of the respective odd and even acquisition blades using weights calculated from acquired k-space data in any part of the correspondingly perpendicular odd or even acquisition blade or in an overlapping region of both perpendicular acquisition blades.

14. The method according to claim 13 further comprising synthesizing k-space data using target signal data calculated using data in a region of odd and even acquisition blade overlap.

15. The method according to claim 13 further comprising correcting the low-resolution differences in phase and magnitude between the acquisition blades using MR data from a region of acquisition blade overlap in the central region of k-space.

16. A non-transitory computer readable storage medium having stored thereon a computer program comprising instructions which when executed by a computer cause the computer to:
  segment acquisition of an echo train into separate corresponding odd and even acquisition blades in k-space, wherein the corresponding odd and even acquisition blades extend orthogonally through a common reference point in a central region of k-space;
  acquire a segment of MR data using a quadratic phase modulation scheme, wherein odd MR echo signals in the echo train are stored in the odd acquisition blade, and even MR echo signals are stored in the even acquisition blade;
  segment acquisition of at least one subsequent echo train into the corresponding odd and even acquisition blades, wherein the corresponding odd and even acquisition blades are rotated at a prescribed interval about the common reference point in the central region of k-space;
  acquire another segment of MR data from the at least one subsequent echo train using the quadratic phase modulation scheme, wherein the odd MR echo signals are again stored in the odd acquisition blade and the even MR echo signals are again stored in the even acquisition blade; and
  reconstruct an image from the odd and even acquisition blades.

17. The computer readable storage medium of claim 16 having further instructions to cause the computer to under-sample each segment of MR data, wherein multiple lines of k-space data in each acquisition blade are initially unfilled, and wherein the unfilled lines of k-space data are bounded by acquired lines of k-space data.

18. The computer readable storage medium of claim 17 having further instructions to cause the computer to synthesize the unfilled lines of k-space data in each of the respective odd and even acquisition blades using weights calculated from acquired lines of k-space in the corresponding odd or even acquisition blade.

19. The computer readable storage medium of claim 16 having further instructions to cause the computer to correct the differences in phase and magnitude between each of the odd and even MR echo signals prior to image reconstruction.

20. The computer readable storage medium of claim 19 having further instructions to cause the computer to correct differences in phase and magnitude between each of the odd and even MR echo signals using MR data from a region of acquisition blade overlap in the central region of k-space.

* * * * *